United States Patent
Kanamura et al.

(10) Patent No.: US 8,222,672 B2
(45) Date of Patent: Jul. 17, 2012

(54) SEMICONDUCTOR DEVICE AND MANUFACTURING METHOD THEREOF

(75) Inventors: Masahito Kanamura, Kawasaki (JP); Masahiro Nishi, Nakakoma (JP)

(73) Assignees: Fujitsu Limited, Kawasaki (JP); Sumitomo Electric Device Innovations, Inc., Yokohama (JP)

( * ) Notice: Subject to any disclaimer, the term of this patent is extended or adjusted under 35 U.S.C. 154(b) by 170 days.

(21) Appl. No.: 11/476,205

(22) Filed: Jun. 28, 2006

(65) Prior Publication Data

US 2007/0228415 A1     Oct. 4, 2007

(30) Foreign Application Priority Data

Mar. 30, 2006   (JP) .................................. 2006-094576

(51) Int. Cl.
*H01L 31/102*   (2006.01)
(52) U.S. Cl. ......................................................... 257/189
(58) Field of Classification Search ................... 257/189
See application file for complete search history.

(56) References Cited

U.S. PATENT DOCUMENTS

| | | | | |
|---|---|---|---|---|
| 5,192,987 A * | 3/1993 | Khan et al. | ............... | 257/183.1 |
| 5,674,304 A | 10/1997 | Fukada et al. | | |
| 6,064,082 A * | 5/2000 | Kawai et al. | ................... | 257/192 |
| 6,096,590 A * | 8/2000 | Chan et al. | ...................... | 438/233 |
| 6,576,927 B2 * | 6/2003 | Yoshida et al. | ................. | 257/67 |
| 6,849,882 B2 * | 2/2005 | Chavarkar et al. | ............ | 257/191 |
| 2002/0125506 A1 * | 9/2002 | Yoshida et al. | ................ | 257/213 |
| 2002/0176032 A1 * | 11/2002 | Maeda et al. | ................... | 349/43 |
| 2003/0129791 A1 * | 7/2003 | Yamazaki | ...................... | 438/151 |
| 2004/0051112 A1 * | 3/2004 | Moon et al. | ................... | 257/103 |
| 2004/0201038 A1 * | 10/2004 | Kimura et al. | ................ | 257/192 |
| 2005/0104069 A1 * | 5/2005 | Jun et al. | ......................... | 257/72 |
| 2006/0249750 A1 * | 11/2006 | Johnson et al. | ............... | 257/192 |
| 2007/0018316 A1 | 1/2007 | Nakayama | | |
| 2008/0179743 A1 | 7/2008 | Nakayama | | |

FOREIGN PATENT DOCUMENTS

| | | |
|---|---|---|
| JP | 60-12770 | 1/1985 |
| JP | 6-177388 | 6/1994 |
| JP | 7-109573 | 4/1995 |
| JP | 2004-119821 | 4/2004 |
| JP | 2005-509274 | 4/2005 |
| JP | 2006-165207 | 6/2006 |
| WO | WO 02/093650 A1 | 11/2002 |
| WO | 2005/057641 | 6/2005 |

OTHER PUBLICATIONS

Japanese Office Action mailed Nov. 1, 2011, with English Translation, in counterpart Japanese Application No. 2006-094576.
Japanese Office Action issued for counterpart Japanese Patent Application No. 2006-094576 dated Feb. 28, 2012.

* cited by examiner

*Primary Examiner* — Bradley K Smith
(74) *Attorney, Agent, or Firm* — Kratz, Quintos & Hanson, LLP

(57) ABSTRACT

A semiconductor device is configured so as to comprise a substrate, an n-type semiconductor layer or an undoped semiconductor layer on the substrate, and an ohmic electrode on the n-type semiconductor layer or the undoped semiconductor layer, and the ohmic electrode is configured so as to comprise a tantalum layer formed on the n-type semiconductor layer or the undoped semiconductor layer, an aluminum layer formed on the tantalum layer, and a metal layer formed on the aluminum layer and made of any one material of tantalum, nickel, palladium, and molybdenum.

10 Claims, 10 Drawing Sheets

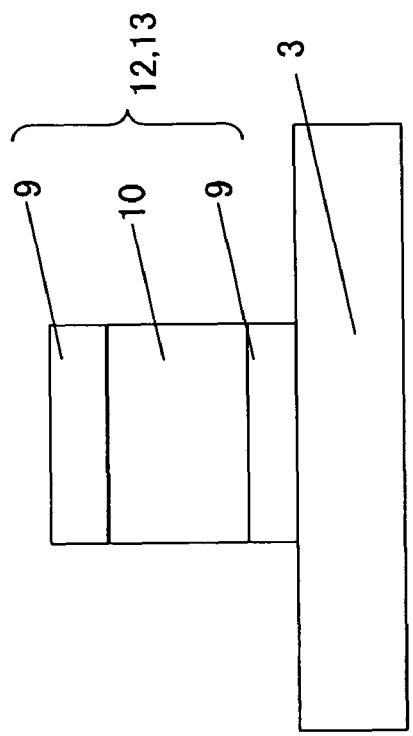
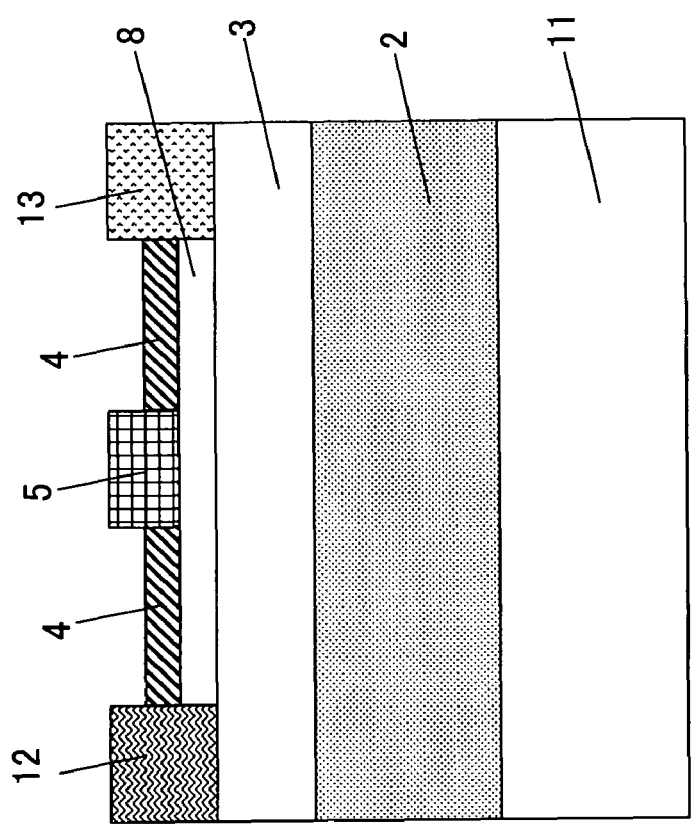

SEMICONDUCTOR DEVICE AND MANUFACTURING METHOD THEREOF

CROSS REFERENCE TO RELATED APPLICATIONS

This application is based on and hereby claims priority to Japanese Application No. 2006-094576 filed on Mar. 30, 2006 in Japan, the contents of which are hereby incorporated by reference.

BACKGROUND OF THE INVENTION (1) Field of the Invention

The present invention relates to a semiconductor device and manufacturing method thereof suitable for use in, for example, a gallium nitride based field effect transistor (GaNFET).

(2) Description of Related Art

Recently, development of a GaNFET (gallium nitride field effect transistor) is actively in progress, which makes use of an AlGaN/GaN hetero junction and the electron transit layer of which is GaN (gallium nitride).

Because of being a material having a wide band gap, a high breakdown electric field strength, and a large saturation electron speed, GaN is highly promising as a material of a high power output device for which a high voltage operation is required.

At present, for example, for a power device for a mobile phone base station, a high voltage operation of 40 V or higher is required and GaNFET is very promising.

For such GaNFET as a high power output device, it is necessary to reduce the contact resistivity of source electrode and drain electrode to increase power efficiency.

Hitherto, a GaNFET has a structure, for example as shown in FIG. 5, in which a GaN electron transit layer 2 and an $Al_xGa_{1-x}N$ ($0 \leq x \leq 1$) electron supply layer 3 are formed in order on a substrate 1 and a gate electrode 5, a source electrode 6, and a drain electrode 7 are provided on the $Al_xGa_{1-x}N$ ($0 \leq x \leq 1$) electron supply layer 3. In FIG. 5, symbol 4 denotes an SiN passivation film.

Then, as the source electrode 6 and the drain electrode 7 (that is, an ohmic electrode) provided on the $Al_xGa_{1-x}N$ ($0 \leq x \leq 1$) electron supply layer 3, a Ti/Al electrode or a Ti/Al/Ni/Au electrode is mainly used.

As a result of the prior art search, published Japanese translation of PCT International Publication for Patent Application, No. 2005-509274 has been obtained.

By the way, as described above, in a GaNFET that uses the Ti/Al electrode or the Ti/Al/Ni/Au electrode as an ohmic electrode, the work function of Ti is 4.3 eV, therefore, there is a problem that a Schottky barrier is formed in between with an n-type III-V group nitride compound semiconductor.

When the Ti/Al electrode or the Ti/Al/Ni/Au electrode is used, a compound is generated at an interface between Ti and Al at the time of annealing to obtain the ohmic properties, and the melting point of the compound is not so high. Further, at the time of annealing, metal condenses, irregularities are formed, and the electrode surface becomes coarse [refer to FIG. 6(A) to FIG. 6(D)]. Furthermore, during operation at high temperatures, the Al atom, which is an electrode constituting element, moves (electromigration). These constitute factors that make the ohmic properties unstable at the time of device process or during operation at high temperatures.

SUMMARY OF THE INVENTION

The inventors of the present invention have proposed one having a Ta/Al lamination structure as an ohmic electrode (for example, refer to Japanese Patent Application No. 2004-353460).

Specifically, as shown in FIG. 7(A) and FIG. 7(B), we have proposed to configure a GaNFET by forming the GaN electron transit layer 2, the $Al_xGa_{1-x}N$ ($0 \leq x \leq 1$) electron supply layer 3, and an n-type GaN layer 8 in order on an SiC substrate 11, providing the gate electrode 5 on the n-type GaN layer 8, and providing the source electrode 6 and the drain electrode 7 having a structure (Ta/Al stacked structure) in which a tantalum (Ta) layer 9 and an aluminum (Al) layer 10 are stacked in order on the $Al_xGa_{1-x}N$ ($0 \leq x \leq 1$) electron supply layer 3. In FIG. 7(A) and FIG. 7(B), symbol 4 denotes an SiN passivation film.

Due to this, it has been made possible to suppress the electrode surface from becoming coarse [refer to FIG. 8(A) and FIG. 8(B)]. Further, it has been made possible to suppress the movement (electromigration) of the Al atom during operation at high temperatures.

Thus, by using the Ta/Al stacked structure for the source electrode 6 and the drain electrode 7 as an ohmic electrode, it has been made possible to realize sufficient reliability in a high temperature environment.

However, aluminum (Al) is exposed on the electrode surface, therefore, there is a possibility that the electrode surface is corroded in a high humidity environment.

Generally, aluminum (Al) turns into aluminum hydroxide by reacting with water in the atmosphere. Since the aluminum hydroxide has a volume three times that of aluminum (Al), damage may be given to the portion (not shown) that covers the surface of the ohmic electrodes 6 and 7 of the SiN passivation film 4.

Aspect of the present invention can provide a semiconductor device and manufacturing method thereof that have been made capable of improving reliability of an ohmic electrode in a high humidity environment while securing sufficient reliability of an ohmic electrode in a high temperature environment.

In accordance with one aspect of the present invention, a semiconductor device comprises a substrate, an n-type semiconductor layer or an undoped semiconductor layer on the substrate, and an ohmic electrode on the n-type semiconductor layer or the undoped semiconductor layer, wherein the ohmic electrode comprises a tantalum layer formed on the n-type semiconductor layer or the undoped semiconductor layer, an aluminum layer formed on the tantalum layer, and a metal layer formed on the aluminum layer and made of any one material of tantalum, nickel, palladium, and molybdenum.

In accordance with another aspect of the present invention, a method for manufacturing a semiconductor device comprises the steps of: forming at least an n-type semiconductor layer or an undoped semiconductor layer on a substrate; forming a tantalum layer, an aluminum layer, and a metal layer made of any one material of tantalum, nickel, palladium, and molybdenum in order on the n-type semiconductor layer or the undoped semiconductor layer; and annealing at temperatures lower than 600° C., and thus forming an ohmic electrode.

Therefore, according to the semiconductor device and its manufacturing method of the above aspects of the present invention, there is an advantage that reliability of an ohmic electrode in a high humidity environment can be improved while securing sufficient reliability of an ohmic electrode in a high temperature environment.

BRIEF DESCRIPTION OF THE DRAWINGS

FIG. 1(A) is a schematic section view showing a configuration of a semiconductor device according to an embodiment of the present invention, also showing its entire configuration.

FIG. 1(B) is a schematic section view showing a configuration of a semiconductor device according to an embodiment of the present invention, also showing a portion of a source electrode or a drain electrode in its enlarged view.

DESCRIPTION OF THE PREFERRED EMBODIMENTS

Figure 2:
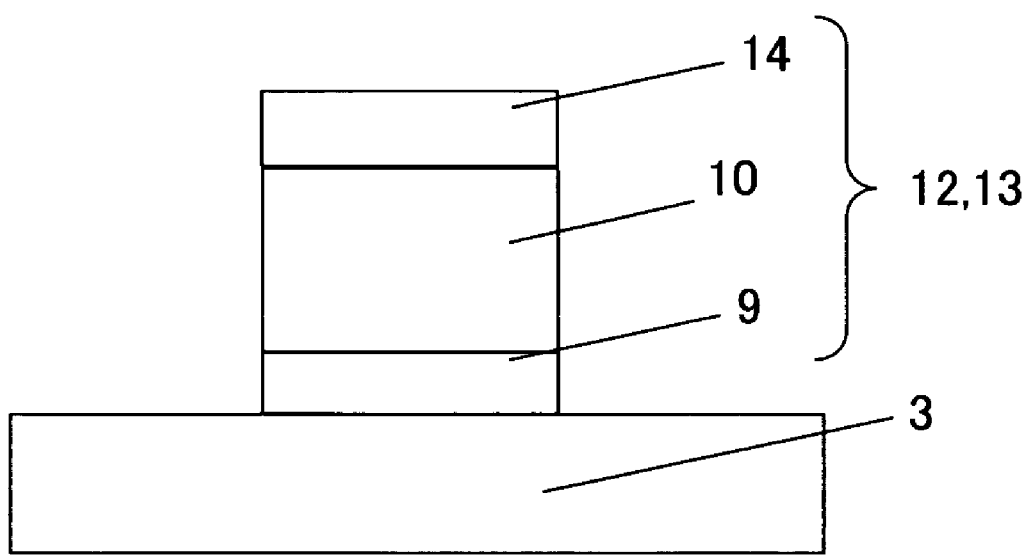
FIG. 2 is a schematic section view showing a configuration of a semiconductor device according to a modification example of an embodiment of the present invention, also showing a part of a source electrode or a drain electrode in its enlarged view.

A semiconductor device and manufacturing method thereof according to an embodiment of the present invention are described below with reference to FIG. 1(A), FIG. 1(B), FIG. 2, and FIG. 3(A) to FIG. 3(J).

The semiconductor device (compound semiconductor device) according to the present embodiment is, for example, a gallium nitride based field effect transistor (GaNFET; here, HEMT; High Electron Mobility Transistor), and has, for example as shown in FIG. 1(A) and FIG. 1(B), a structure in which an intentionally undoped GaN electron transit layer 2 (i-GaN layer) 2, an electron supply layer 3 made of an n-type $Al_xGa_{1-x}N$ ($0 \leq x \leq 1$) layer (n-AlGaN layer), and an n-type GaN layer (n-GaN layer) 8 are stacked in order on an SiC (silicon carbide) substrate 11. By the way, a spacer layer [for example, an intentionally undoped $Al_xGa_{1-x}N$ ($0 \leq x \leq 1$) layer (i-AlGaN layer)] may be provided between the electron transit layer 2 and the electron supply layer 3.

On the n-type GaN layer (n-GaN layer) 8, a gate electrode 5 is provided. In other words, the gate electrode 5 is in Schottky contact with the n-GaN layer 8. On the other hand, on opposite sides of the gate electrode 5, a source electrode 12 and a drain electrode 13 are provided on the $Al_xGa_{1-x}N$ ($0 \leq x \leq 1$) electron supply layer 3 (that is, n-type GaN based semiconductor layer; n-type III-V group nitride compound semiconductor layer). In other words, both the source electrode 12 and the drain electrode 13 are in ohmic contact with the $Al_xGa_{1-x}N$ ($0 \leq x \leq 1$) electron supply layer 3. In FIG. 1(A), symbol 4 denotes an SiN passivation film.

In the present embodiment, both the source electrode 12 and the drain electrode 13 are configured so as to have, for example, a Ta/Al/Ta stacked structure in which a tantalum (Ta) layer (first layer) 9, an aluminum (Al) layer (second layer) 10, and the tantalum (Ta) layer (third layer) 9 are stacked in order, as shown in FIG. 1(B).

In the present embodiment, in order to configure a high power output device for which a high voltage operation is required, an SiC substrate (high resistance substrate, semi-insulating substrate) having a resistivity of $1 \times 10^6$ Ω·cm or more is used as the SiC substrate 11. The substrate is not limited to this and for example, a conductive substrate (low resistance substrate; for example, metal substrate) having a resistivity of $1 \times 10^5$ Ω·cm or less may be used.

The structure of the source electrode 12 and the drain electrode 13 as an ohmic electrode is not limited to this but it is only required to configure so as to have a structure in which a metal layer made of any one material of tantalum (Ta), palladium (Pd), nickel (Ni), and molybdenum (Mo) is stacked on the Ta/Al stacked structure in which the tantalum (Ta) layer 9 and the aluminum (Al) layer 10 are stacked in order.

For example, as shown in FIG. 2, it may also be possible to configure both the source electrode 12 and the drain electrode 13 so as to have a Ta/Al/Pd stacked structure in which the tantalum (Ta) layer 9, the aluminum (Al) layer 10, and a palladium (Pd) layer 14 are stacked in order. Further, although not shown, it may also be possible to configure both the source electrode 12 and the drain electrode 13 so as to have a Ta/Al/Ni stacked structure in which the tantalum (Ta) layer 9, the aluminum (Al) layer 10, and a nickel (Ni) layer are stacked in order, or configure both the source electrode 12 and the drain electrode 13 so as to have a Ta/Al/Mo stacked structure in which the tantalum (Ta) layer 9, the aluminum (Al) layer 10, and the molybdenum (Mo) layer are stacked in order. By the way, in FIG. 2, a part of the source electrode 12 or the drain electrode 13 is shown in its enlarged view.

Figure 9:
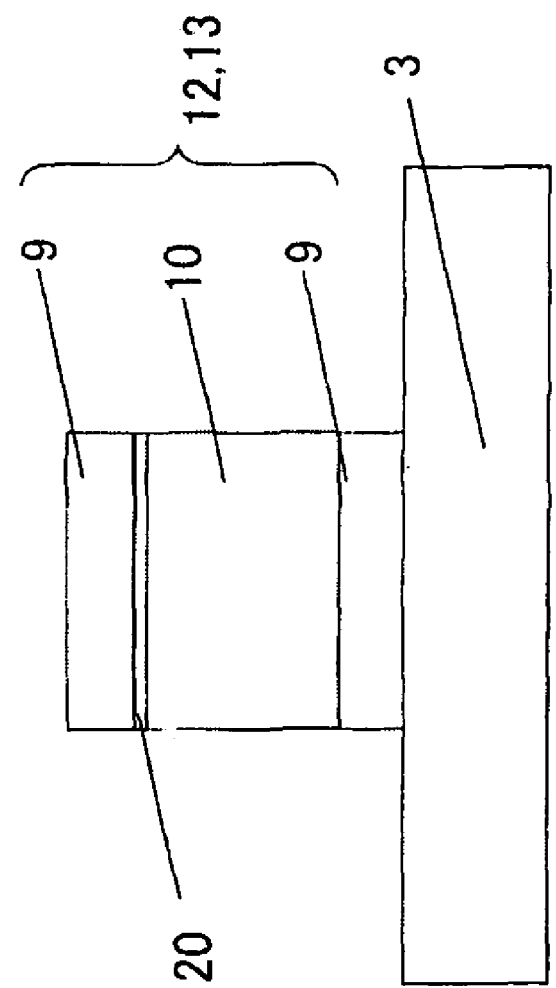
FIG. 9 is a schematic section view showing a portion of a source electrode or a drain electrode according to another embodiment of the present invention.

As described above, when a metal layer 9 made of any one material of tantalum, nickel, palladium, and molybdenum (MO) is formed on the aluminum layer 10, the aluminum layer 10 reacts with the metal layer at the time of annealing and a compound layer 20 of the material that forms the metal layer and aluminum is generated at the interface between the aluminum layer 10 and the metal layer as a result (see FIG. 9). In this case, the semiconductor device comprises the compound layer of the material that forms the metal layer and aluminum between the aluminum layer 10 and the metal layer.

The reason that the source electrode 12 and the drain electrode 13 as an ohmic electrode are configured as described above in the present embodiment is as follows.

First, tantalum (Ta) has a melting point as extremely high as about 3,000° C. and is excellent in thermal stability, and the work function thereof is smaller than that of titanium (Ti). In addition, a compound generated when tantalum (Ta) and aluminum (Al) react with each other has a melting point higher than that of a compound generated when titanium (Ti) and aluminum (Al) react with each other. Therefore, tantalum (Ta) is used instead of titanium (Ti) conventionally used. Due to this, it is possible to improve the thermal stability and mechanical strength of the ohmic electrodes 12 and 13 considerably. In particular, it is possible to realize the ohmic electrodes 12 and 13 excellent in the long-term reliability in a high temperature environment.

Materials having a high melting point include tungsten, however, it is rather difficult to continuously evaporate tungsten for formation using, for example, the electron beam-physical vapor deposition (EB-PVD), therefore, tantalum (Ta) is used taking into consideration the easiness in handling during process.

Further, the reason that a Ta/Al stacked structure is employed is in order to suppress electromigration of the Al atom during operation at high temperatures by forming the tantalum layer 9 having a high melting point below the aluminum layer 10.

If the aluminum layer 10 is formed on the tantalum layer 9, the tantalum layer 9 and the aluminum layer 10 react with each other at the time of annealing and a compound layer of them is generated as a result at the interface between the tantalum layer 9 and the aluminum layer 10. In this case, the semiconductor device comprises, as a result, the compound layer of tantalum and aluminum between the tantalum layer 9 and the aluminum layer 10.

On the other hand, if aluminum (Al) is exposed on the electrode surface, there is a possibility that the electrode surface may be corroded in a high humidity environment. Therefore, on the Ta/Al stacked structure, a metal layer (cap layer) made of any one material of tantalum (Ta), palladium (Pd), nickel (Ni), and molybdenum (Mo) as a metal material having moisture resistance, that is, a metal material resistant to, for example, water, ammonium, hydrochloric acid, etc., is stacked to cover the surface of aluminum (Al), and thus the surface of the ohmic electrodes 12 and 13 is suppressed from being corroded.

As described above, the margin of the process is extended by forming the metal layer using a metal material, the melting point of the metal alone of which is high, the melting point of which is still high even after turning into a compound by reacting with aluminum (Al), and which has moisture resistance, on the Ta/Al stacked structure.

In particular, in a case where the source electrode 12 and the drain electrode 13 as an ohmic electrode are configured so as to have a Ta/Al/Ta stacked structure, a structure is constructed in which the aluminum (Al) layer 10 is sandwiched in the vertical direction by the tantalum (Ta) layers 9 having the same coefficient of thermal expansion, therefore, when annealing is performed, for example, at temperatures below 600° C. (preferably, in the range of 530° C. to 570° C., or most preferably, 550° C.) in order to obtain the ohmic properties, the thermal stresses of the upper and lower tantalum (Ta) layers 9 are cancelled and an effect can be obtained that hillocks are prevented from occurring in the aluminum (Al) layer 10 by thermal cycle.

Figure 4B:
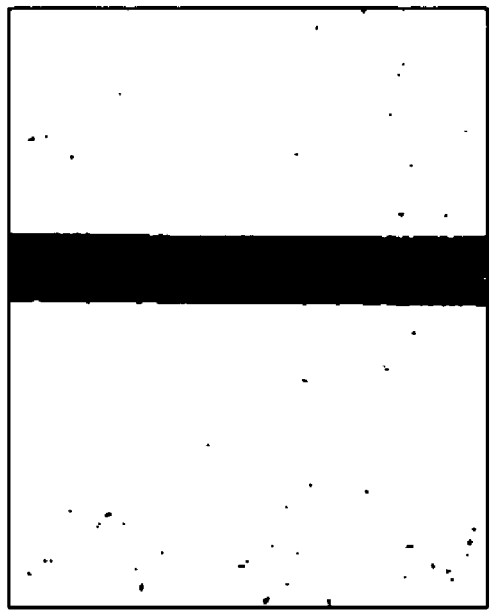
FIG. 4(B) is a diagram schematically showing the photo in FIG. 4(A).
Figure 4A:
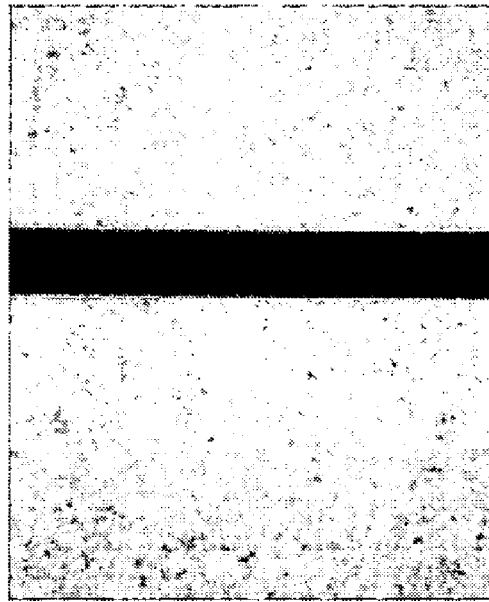
FIG. 4(A) is a photo instead of a diagram showing an electrode surface of a semiconductor device according to an embodiment of the present invention in its partially enlarged view.
Figure 5:
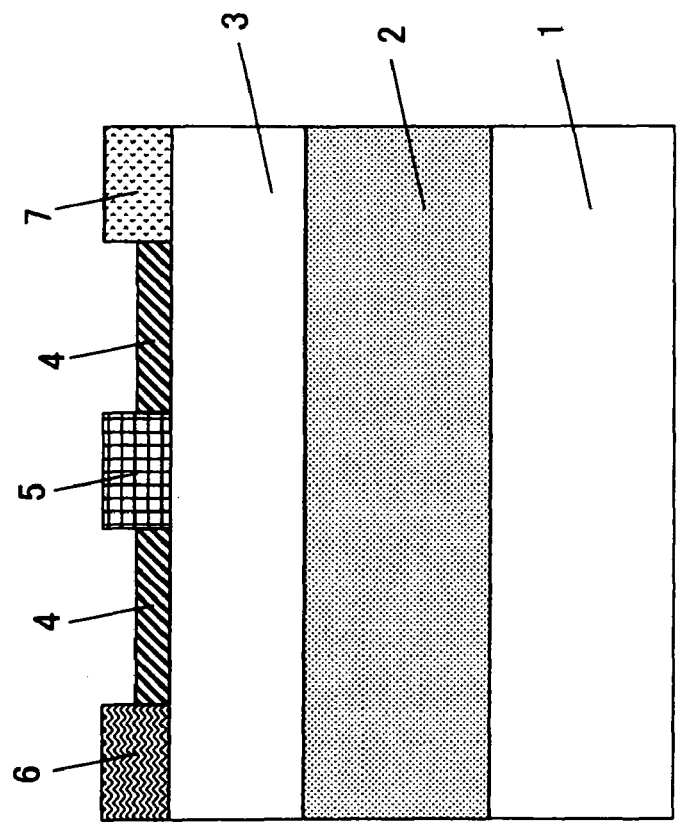
FIG. 5 is a schematic section view showing a configuration of a conventional semiconductor device.
Figure 6C:
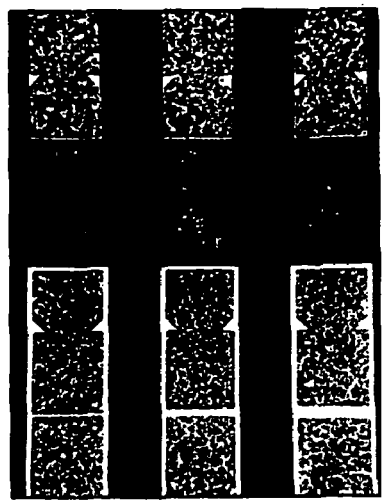
FIG. 6(C) and FIG. 6(D) are diagrams schematically showing the photos in FIG. 6(A) and FIG. 6(B), respectively.
Figure 6D:
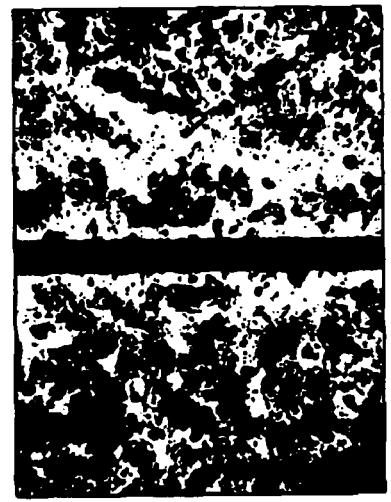
Figure 6A:
FIG. 6(A) is a photo instead of a diagram showing an electrode surface of a conventional semiconductor device.
Figure 6B:
FIG. 6(B) is a diagram showing a part of FIG. 6(A) in its enlarged view.
Figure 7B:
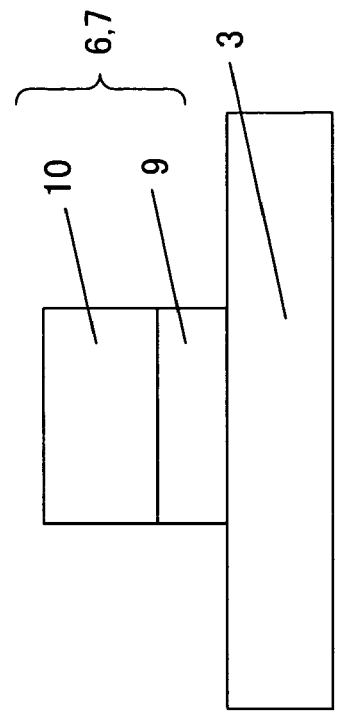
FIG. 7(B) is a schematic section view showing a configuration of a semiconductor device proposed in the course of development of the present invention, also showing a part of a source electrode or a drain electrode in its enlarged view.
Figure 7A:
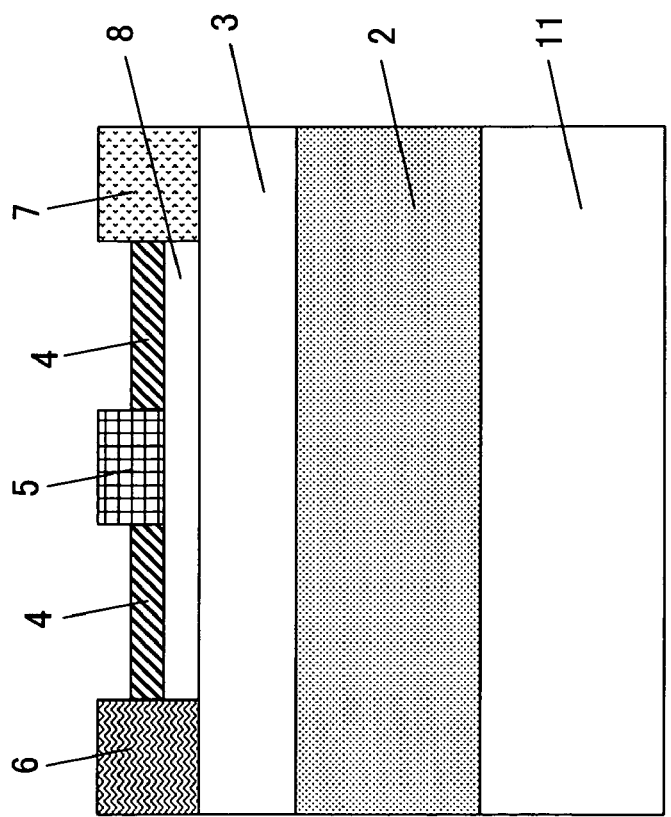
FIG. 7(A) is a schematic section view showing a configuration of a semiconductor device proposed in the course of development of the present invention, also showing its entire configuration.
Figure 8A:
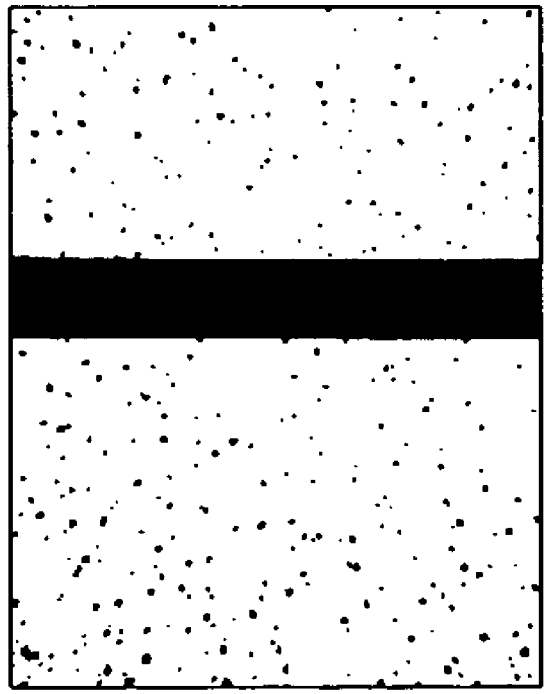
FIG. 8(A) is a photo instead of a diagram showing an electrode surface of a semiconductor device proposed in the course of development of the present invention in its partially enlarged view.
Figure 8B:
FIG. 8(B) is a diagram schematically showing the photo in FIG. 8(A).

Due to this, as shown in FIG. 4(A) and FIG. 4(B), it is possible to suppress the electrode surface from becoming coarse and a flat and excellent surface can be obtained (that is, a surface hillock suppression effect is obtained) In other words, it will be understand that by employing the Ta/Al/Ta stacked structure, the electrode surface is suppressed from becoming coarser than the electrode surface [refer to FIG. 8(A) and FIG. 8(B)] in the Ta/Al stacked structure proposed in the course of development of the present invention, as shown in FIG. 4(A) and FIG. 4(B), and a flat and excellent surface can be obtained.

Materials having a high melting point include tungsten, however, it is rather difficult to continuously evaporate tungsten for formation using, for example, the electron beam-physical vapor deposition (EB-PVD), therefore, anyone of tantalum (Ta), palladium (Pd), nickel (Ni), and molybdenum (Mo) is used taking into consideration the easiness in handling during process.

Next, the method for manufacturing a semiconductor device (for example, GaNFET) according to the present embodiment is described with reference to FIG. 3(A) to FIG. 3(J).

Figure 3A:
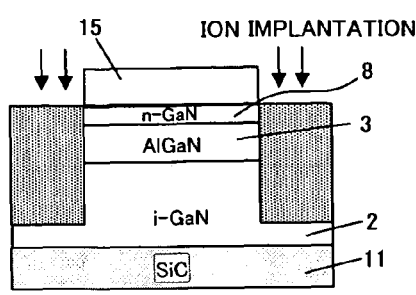
FIG. 3(A) to FIG. 3(J) are schematic section views for explaining a method for manufacturing a semiconductor device according to an embodiment of the present invention.

First, as shown in FIG. 3(A), the intentionally undoped GaN electron transit layer 2 (for example, 3 μm in thickness), the electron supply layer 3 made of an n-type $Al_{0.25}Ga_{0.75}N$ layer (n-AlGaN layer; for example, 20 nm in thickness; Si doping concentration of $2\times10^{18}$ cm$^{-3}$), and the n-GaN layer 8 [for example, 10 nm or less in thickness (for example, 5 nm); Si doping concentration of $2\times10^{18}$ cm$^{-3}$] are stacked in order on the SiC (silicon carbide) substrate 11 to form a stacked structure using the normal metal organic chemical vapor deposition (MOVPE) method.

A spacer layer [intentionally undoped $Al_{0.25}Ga_{0.75}N$ layer (i-AlGaN layer; for example, 3 nm in thickness)] may be provided between the electron transit layer 2 and the electron supply layer 3. Further, the configuration of the n-GaN layer 8 is not limited to this and it is only necessary to use one doped with n-type impurity materials of $1\times017$ cm$^{-3}$ or more.

Next, as shown in FIG. 3(A), separation between elements is performed by, for example, applying a resist 15 and performing ion implantation to make both sides inactive. Separation between elements may be performed by removing both sides by etching.

Next, as shown in FIG. 3(B) to FIG. 3(E), on the n-AlGaN electron supply layer 3, the source electrode 12 and the drain electrode 13 as an ohmic electrode are formed using the deposition lift-off method.

Figure 3F:
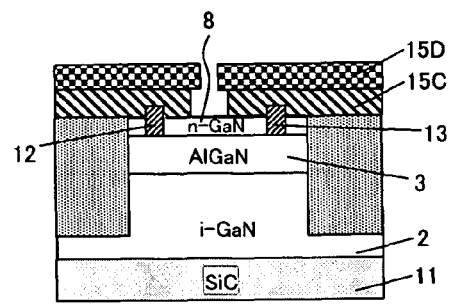
Figure 3B:
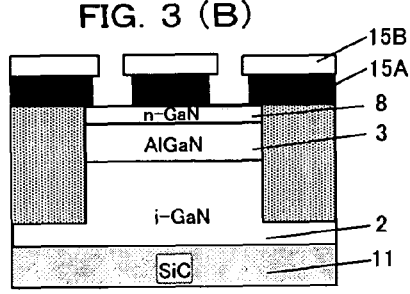

In other words, first, as shown in FIG. 3(B), after resists (here, two layers) 15A and 15B are applied to the entire surface, patterning is performed so that an opening is formed in a source electrode formation scheduled region and a drain electrode formation scheduled region, respectively.

Figure 3G:
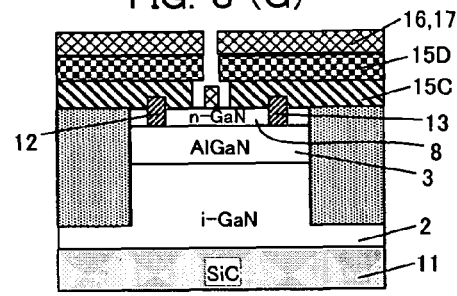
Figure 3C:
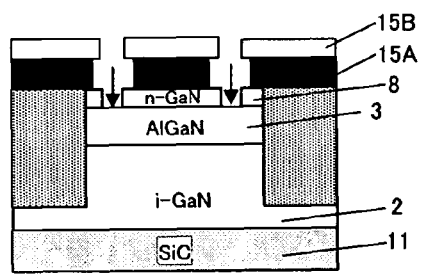

Next, as shown in FIG. 3(C), the portion of the n-GaN layer 8, which forms the source electrode 12 and the drain electrode 13, is removed by the dry etching method using, for example, a chlorine based gas (for example, $Cl_2$ gas) or an inert gas.

Figure 3H:
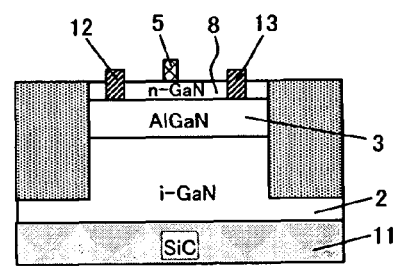
Figure 3D:
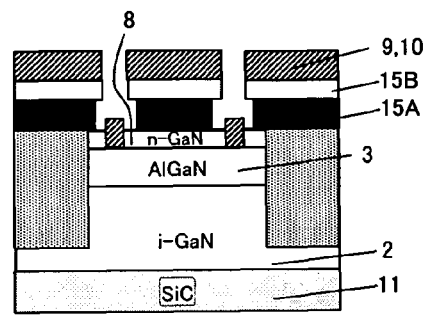

Next, as shown in FIG. 3(D), tantalum (Ta) 9 (for example, 10 nm in thickness), aluminum (Al) 10 (for example, 280 nm in thickness), and tantalum (Ta) 9 (for example, 10 nm in thickness) are evaporated in order.

Figure 3I:
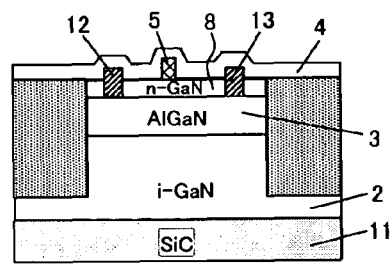
Figure 3E:
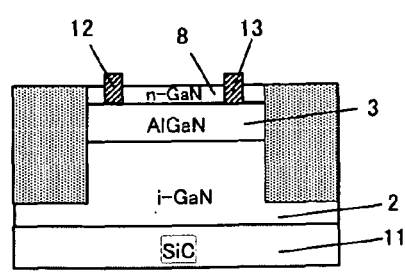

Then, as shown in FIG. 3(E), by removing the resists 15A and 15B using a removing liquid, the source electrode 12 and the drain electrode 13 having a Ta/Al/Ta stacked structure are formed.

After this, annealing is performed at temperatures below 600° C. (preferably, in the range of 530° C. to 570° C., or most preferably, 550° C.) in order to obtain the ohmic properties and thus the source electrode 12 and the drain electrode 13 as an ohmic electrode that come into ohmic contact with the n-AlGaN layer are formed. By performing annealing at such temperatures, the metal becomes more unlikely to condense and the electrode surface does not become coarse, and an excellent and flat surface can be obtained [refer to FIG. 4(A) and FIG. 4(B)].

Next, as shown in FIG. 3(F) to FIG. 3(H), a gate electrode is formed on the n-GaN layer 8 using the deposition lift-off method.

In other words, first, as shown in FIG. 3(F), after resists (here, two layers) 15C and 15D are applied to the entire surface, patterning is performed so that an opening (its width is less than that of the n-GaN layer 8; for example, 1 μm) is formed in a gate electrode formation scheduled region on the n-GaN layer 8.

Next, as shown in FIG. 3(G), nickel (Ni) 16 and gold (Au) 17 are evaporated in order. Then, as shown in FIG. 3(H), by removing the resists 15C and 15D using a removing liquid, the gate electrode 5 having a Ni/Au stacked structure in which the nickel (Ni) layer 16 and the gold (Au) layer 17 are stacked.

After this, as shown in FIG. 3(I), the SiN passivation film 4 is deposited and formed having a thickness of, for example, 10 nm on the entire surface using, for example, the chemical vapor deposition (CVD) method.

Figure 3J:
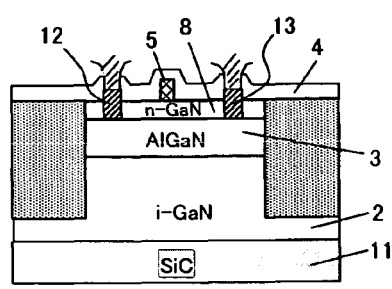

Then, as shown in FIG. 3(J), part of the SiN passivation film 4 on the source electrode 12 and the drain electrode 13 is removed and a wire is provided so as to be connected to the source electrode 12 and the drain electrode 13.

In this manner, the GaNFET as the semiconductor device according to the present embodiment is completed.

Therefore, according to the semiconductor device and its manufacturing method of the present invention, there is an advantage that reliability of an ohmic electrode in a high humidity environment can be improved while securing sufficient reliability of an ohmic electrode in a high temperature environment.

The present invention is not limited to the embodiment described above and there can be various modifications without departing from the concept of the present invention.

For example, in the embodiment described above, the semiconductor layer with which the source electrode 12 and the drain electrode 13 as an ohmic electrode come into contact is an n-type semiconductor layer, however, this is not limited and for example, an undoped semiconductor layer (that is, undoped GaN based semiconductor layer; undoped III-V group nitride compound semiconductor layer) may be used.

Further, in the embodiment described above, the configuration is such that the n-GaN layer 8 in the source electrode formation scheduled region and the drain electrode formation scheduled region is removed and there is no n-GaN layer 8 below the source electrode 12 and the drain electrode 13, however, this is not limited.

For example, the n-GaN layer 8 in the source electrode formation scheduled region and the drain electrode formation scheduled region may be left thinly instead of being removed completely. In other words, there may be the n-GaN layer 8 below the source electrode 12 and the drain electrode 13. In this case, the n-GaN layer 8 is thinner in thickness at a portion below the source electrode 12 and the drain electrode 13 than at a portion below the gate electrode 5.

Figure 10:
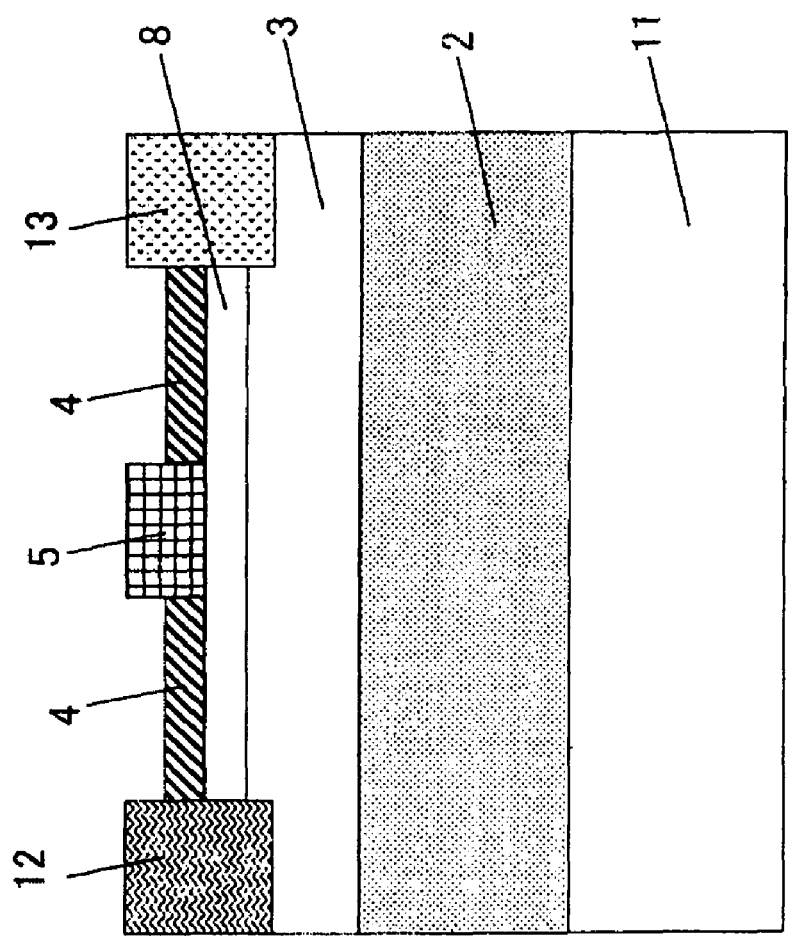
FIG. 10 is a schematic view showing a configuration of a semiconductor device of yet another embodiment the present invention.

Further, for example, as well as the GaN layer 8 in the source electrode formation scheduled region and the drain electrode scheduled formation region, part of the $Al_xGa_{1-x}N$ ($0 \leq x \leq 1$) electron supply layer 3, which is below the GaN layer 8, may also be removed. In this case, the $Al_xGa_{1-x}N$ ($0 \leq x \leq 1$) electron supply layer 3 is thinner in thickness at a portion below the source electrode 12 and the drain electrode 13 than at a portion below the gate electrode 5 (see FIG. 10).

In the embodiment described above, explanation is given with a field effect transistor as an example, however, this is not limited, and the present invention can be applied widely to other semiconductor devices (in particular, a GaN based semiconductor device which is provided with an electrode in an n-type or an undoped semiconductor layer) such as a diode.

Further, in the embodiment described above, annealing is performed at predetermined temperatures (below 600° C.), however, this is not limited. For example, ion implantation or the like may be performed in the region [region immediately below the ohmic electrodes 12 and 13 in the $Al_xGa_{1-x}N$ ($0 \leq x \leq 1$) electron supply layer 3], which will be the backing layer of the ohmic electrodes 12 and 13 in the $Al_xGa_{1-x}N$ ($0 \leq x \leq 1$) electron supply layer 3, so that the concentration (doping concentration; electron concentration) of the n-type impurity material in these regions is increased, thereby, obviating annealing for obtaining the ohmic properties.

In the embodiment described above, the n-GaN layer 8 is provided below the gate electrode 5, however, this is not limited, and the present invention can be applied to a semiconductor device having no n-GaN layer.

What is claimed is:

1. A semiconductor device comprising:
    a substrate;
    an n-type nitride semiconductor layer or an undoped nitride semiconductor layer over the substrate; and
    a source electrode and a drain electrode being in direct physical contact with and being in ohmic contact with said n-type nitride semiconductor layer or said undoped nitride semiconductor layer;
    wherein each of said source electrode and said drain electrode comprises:
    a tantalum layer formed on said n-type nitride semiconductor layer or said undoped nitride semiconductor layer;
    an aluminum layer formed on said tantalum layer and made of aluminum only; and
    a metal layer formed on said aluminum layer and made of any one material of tantalum, nickel and palladium;
    further comprising a compound layer of aluminum and any one material of tantalum, nickel and palladium between said aluminum layer and said metal layer; and
    a gate electrode comprising a nickel layer and a gold layer formed on the nickel layer.

2. The semiconductor device according to claim 1, wherein said n-type nitride semiconductor layer or said undoped nitride semiconductor layer is a III-V group nitride compound semiconductor layer.

3. The semiconductor device according to claim 1, further comprising an $Al_xGa_{1-x}N$ ($0 \leq x \leq 1$) layer as said n-type nitride semiconductor layer or said undoped nitride semiconductor layer, and being a field effect transistor having a gate electrode.

4. The semiconductor device according to claim 3, further comprising:
    a GaN electron transit layer formed below said $Al_xGa_{1-x}N$ ($0 \leq x \leq 1$) electron supply layer; and
    a GaN layer formed between said gate electrode and said $Al_xGa_{1-x}N$ ($0 \leq x \leq 1$) electron supply layer;
    wherein said $Al_xGa_{1-x}N$ ($0 \leq x \leq 1$) layer is an $Al_xGa_{1-x}N$ ($0 \leq x \leq 1$) electron supply layer.

5. The semiconductor device according to claim 4, wherein said GaN layer is doped with n-type impurity materials of $1 \times 10^{17}$ cm$^{-3}$ or more.

6. The semiconductor device according to claim 4, wherein said GaN layer is formed below said source electrode and said drain electrode, wherein said GaN layer is thinner in thickness at a portion below said source electrode and said drain electrode than at a portion below said gate electrode.

7. The semiconductor device according to claim 4, wherein said $Al_xGa_{1-x}N$ ($0 \leq x \leq 1$) electron supply layer is thinner in thickness at a portion below said source electrode and said drain electrode than at a portion below said gate electrode.

8. The semiconductor device according to claim 1, wherein said substrate is a silicon carbide substrate having a resistivity of $1 \times 10^6$ Ω·cm or more.

9. The semiconductor device according to claim 1, wherein said substrate is a conductive substrate having a resistivity of $1 \times 10^5$ Ω·cm or less.

10. A semiconductor device comprising:
a substrate;
an n-type nitride semiconductor layer or an undoped nitride semiconductor layer over the substrate; and
a source electrode and a drain electrode being in direct physical contact with and being in ohmic contact with said n-type nitride semiconductor layer or said undoped nitride semiconductor layer;
wherein each of said source electrode and said drain electrode comprises:
a first tantalum layer formed on said n-type nitride semiconductor layer or said undoped nitride semiconductor layer;
an aluminum layer formed on said first tantalum layer and made of aluminum only; and
a second tantalum layer formed on said aluminum layer;
further comprising a compound layer of aluminum and tantalum between said aluminum layer and said second tantalum layer; and
a gate electrode comprising a nickel layer and a gold layer formed on the nickel layer.

* * * * *